United States Patent
Ono et al.

(10) Patent No.: US 7,374,741 B2
(45) Date of Patent: *May 20, 2008

(54) METHOD FOR GROWING SILICON SINGLE CRYSTAL AND SILICON WAFER

(75) Inventors: Toshiaki Ono, Tokyo (JP); Wataru Sugimura, Tokyo (JP); Masataka Hourai, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/502,609

(22) Filed: Aug. 9, 2006

(65) Prior Publication Data
US 2007/0034138 A1 Feb. 15, 2007

(30) Foreign Application Priority Data
Aug. 12, 2005 (JP) .............................. 2005-234034

(51) Int. Cl.
*C30B 15/20* (2006.01)
(52) U.S. Cl. ..................... 423/328.2; 117/13; 117/19; 117/20; 117/932
(58) Field of Classification Search .................. 117/13, 117/19, 20, 932; 423/328.2
See application file for complete search history.

(56) References Cited

U.S. PATENT DOCUMENTS

| | | | |
|---|---|---|---|
| 6,569,237 B2 * | 5/2003 | Tanaka et al. | 117/19 |
| 6,843,847 B1 * | 1/2005 | Iida et al. | 117/13 |
| 2006/0156969 A1 * | 7/2006 | Hourai et al. | 117/89 |

FOREIGN PATENT DOCUMENTS

EP        1598452 A1    11/2005
WO    WO2004/083496    9/2004

* cited by examiner

*Primary Examiner*—Felisa C Hiteshew
(74) *Attorney, Agent, or Firm*—Kolisch Hartwell, P.C.

(57) ABSTRACT

In this method for growing a silicon single crystal, an ambient gas where a single crystal is grown contains a gas hydrogen-containing substance, and a silicon single crystal is grown at a pull rate to form a dislocation cluster defect occurrence region at least in a portion of a radial cross section of said silicon single crystal and at a pull rate which is slower than that to form an laser scattering tomography defect occurrence region, according to the Czochralski method. This silicon wafer is sampled from a straight body of the silicon single crystal grown using said method for growing a silicon single crystal, and the LPD density of LPD of 0.09 μm or greater in the surface after 10 times of repetitions of the SC-1 cleaning is 0.1/cm² or less.

7 Claims, 3 Drawing Sheets

METHOD FOR GROWING SILICON SINGLE CRYSTAL AND SILICON WAFER

BACKGROUND OF THE INVENTION

1. Field of the Invention

The present invention relates to a method for growing a silicon single crystal and a silicon wafer, and particularly relates to a method for growing a silicon single crystal which enables the growth of a silicon single crystal including a dislocation cluster defect occurrence region having a low density of LPD (Light Point Defect) of 0.09 μm or greater.

This application claims priority from Japanese Patent Application No. 2005-234034 filed on Aug. 12, 2005, the content of which is incorporated herein by reference.

2. Background Art

As a method for manufacturing a silicon single crystal which is a starting material of a silicon wafer, a growing method in accordance with the Czochralski method (hereafter, referred to as "CZ method") is known.

It is known that minute defects which become exposed in a device manufacturing process, i.e., a grown-in defect is generated in the silicon single crystal manufactured using the CZ method. FIG. 1 is a cross sectional view for explaining the radial defect distribution state of the silicon single crystal obtained using the CZ method. As shown in FIG. 1, the grown-in defects of the silicon single crystal obtained using the CZ method includes vacancy defects of which sizes are approximately 0.1 to 0.2 μm, such as laser scattering tomography defects or COP (Crystal Originated Particle) and minute dislocation of which sizes are approximately 10 μm such as dislocation cluster defects.

Moreover, in the silicon single crystal shown in FIG. 1, oxygen induced stacking faults (hereafter, referred to as OSF) distribute like a ring in a region of approximately ⅔ of the external diameter. There is a region (laser scattering tomography defect occurrence region) where approximately $10^5$ to $10^6/cm^3$ of the laser scattering tomography defects are detected inside the OSF occurrence region where the OSFs are generated, and there is a region (dislocation cluster defect occurrence region) where approximately $10^3$ to $10^4/cm^3$ of the dislocation cluster defects exist outside the OSF occurrence region.

FIG. 2 is a drawing for explaining the defect distribution state on the cross section of a silicon single crystal grown by gradually decreasing the pull rate during its growth. Here, FIG. 1 is a cross sectional view of the silicon single crystal grown at a pull rate equivalent to the position A in FIG. 2.

As shown in FIG. 2, a ring-forming OSF occurrence region appears around the periphery of the crystal in the stage at a faster pull rate, and the inside portion of the OSF occurrence region becomes an laser scattering tomography defect occurrence region where many laser scattering tomography defects are generated. Decreasing the pull rate, the diameter of the OSF occurrence region becomes smaller and a dislocation cluster defect occurrence region where dislocation cluster defects are generated appears at the outside portion of the OSF occurrence region, and then, the OSF occurrence region disappears and the dislocation cluster defect occurrence region appears on the entire surface.

Moreover, an oxygen precipitation promoted region (PV region) where oxygen precipitates (BMD: Bulk Micro Defect) may be formed exists outside the ring-forming OSF occurrence region and making contact with the ring-forming OSF occurrence region, and an oxygen precipitation inhibited region (PI region) where no oxygen precipitation is generated exists between the oxygen precipitation promoted region and the dislocation cluster defect occurrence region. The oxygen precipitation promoted region (PV region), the oxygen precipitation inhibited region (PI regoion) and the ring-forming OSF occurrence region are all defect-free regions where the grown-in defects are extremely low.

As a hot zone structure for growing a silicon single crystal using the CZ method, for example, a hot zone structure where a temperature gradient at the center of the crystal (Gc) is the same or greater than a temperature gradient at the outer circumferential portion of the crystal (Ge) (Gc≧Ge) is proposed (for example, Patent Document 1). FIG. 3 is a drawing for explaining another defect distribution state of the cross section of a silicon single crystal grown by gradually decreasing pull rate during its growth using an apparatus for growing a single crystal having the hot zone structure where the temperature gradient at the center of the crystal (Gc) is the same or greater than a temperature gradient at the outer circumferential portion of the crystal (Ge) (Gc≧Ge).

As shown in FIG. 3, when a silicon single crystal is grown at the pull rate within a range from B to C shown in FIG. 3 using an apparatus for growing a single crystal having a hot zone structure which satisfies Gc≧Ge, a temperature gradient G on the crystal side at or in the vicinity of a solid-liquid interface is controlled and a silicon single crystal of which radial cross section is uniform defect-free region throughout the entire thereof can be obtained.

In addition, in Patent Document 1, technology to increase a pull rate margin of a defect-free crystal by adding hydrogen into a growth furnace using an apparatus for growing a single crystal having the hot zone structure which satisfies Gc≧Ge is proposed. FIG. 4 is a drawing for explaining another defect distribution state of the cross section of a silicon single crystal, grown by supplying an inert gas where hydrogen is added to a growth furnace and by gradually decreasing the pull rate during its growth, using an apparatus for growing a single crystal having a hot zone structure (wherein Gc≧Ge), which is the same as that in FIG. 3. In the case in which an ambient gas where a single crystal is grown is a mixed gas of an inert gas and hydrogen gas, the generation of COP and dislocation cluster defects can be inhibited. Therefore, in comparison with the example shown in FIG. 3 where no hydrogen is added to the growth furnace, as shown in FIG. 4, a critical pull rate for the pull rate range (the range from B to C in FIG. 3 and the range from D to E in FIG. 4) at which a defect-free crystal can be grown may be made faster.

In accordance with the technology described in Patent Document 1, a silcon single crystal where no COP or dislocation cluster defect exists may be grown, and a silicon wafer manufactured from this silicon single crystal may be used as a high-quality prime wafer. However, if the pull rate range is deviated even slighltly, there is the inconvenience that COP and/or dislocation cluster defects are generated. In particular, a wafer where the dislocation cluster defects have been generated deteriorates the electrical properties of a device; thereby, it cannot be used as a prime wafer. However, a silicon single crystal where the dislocation cluster defects are detected may be used, for example, as a material for a LPD monitoring wafer to monitor an LPD size of 0.11 μm or greater.

However, in accordance with the recent miniaturization of integrated circuits, the LPD size to be monitored has become smaller. Specifically, for example, the LPD size to be monitored becomes smaller, less than 0.11 μm. Consequently, miniaturization technology for the dislocation cluster defect size in a wafer is required. Moreover, since the LPD monitoring wafer is repeatedly used, a wafer where the LPD density does not increase after repetitive cleaning is in demand.

However, a conventional LPD monitoring wafer sometimes cannot accurately monitor because a density of LPD having a size of greater than that to be monitored is high on the wafer surface, or the density of LPD having a size of greater than that to be monitored is drastically increased by SC-1 of the surface.

The present invention considers the above circumstances, and has the objective of providing a method for growing a silicon single crystal where a silicon single crystal containing a dislocation cluster defect occurrence region and having a low density of LPD of 0.09 µm or greater can be grown.

Moreover, the present invention aims to provide a silicon wafer that is sampled from a straight body section of the silicon single crystal grown using the method for growing a silicon single crystal, and that can be suitably used for a high-accuracy LPD monitoring wafer.

(Patent Document 1) International Patent Publication No. WO02004/083496

SUMMARY OF THE INVENTION

In order to resolve the problem, the method for growing a silicon single crystal of the present invention includes growing a silicon single crystal by the Czochralski method, wherein an ambient gas in which the silicon single crystal is grown includes a hydrogen-containing substance in gaseous form, and the silicon single crystal is grown at a pull rate at which dislocation cluster defect occurrence region is formed at least in a portion of the radial cross section of the silicon crystal, and at a pull rate slower than that at which an laser scattering tomography defect occurrence region is formed.

In the method for growing a silicon single crystal of the present invention, a hot zone structure where a temperature gradient at the center of the crystal (Gc) is the same or greater than that at the outer circumferential portion of the crystal (Ge) (Gc≧Ge) may be used, and the silicon single crystal may be grown within a pull rate range where an almost entire radial region of the silicon single crystal becomes the dislocation cluster defect occurrence region.

The silicon single crystal may be grown at a pull rate slower than that at which a dislocation cluster defect occurrence region where the Wright etching defect density becomes $5 \times 10^4/cm^2$ or greater on the radial cross section of the silicon single crystal is formed.

The silicon single crystal may be grown at a pull rate slower than that at which a dislocation cluster defect occurrence region where the Secco etching defect density becomes $3 \times 10^4/cm^2$ or greater on the radial cross section of the silicon single crystal is formed.

The hydrogen-containing substance in gaseous form may be hydrogen gas.

The concentration of the hydrogen-containing substance in the ambient gas may be within the range of 40 to 400 Pa of hydrogen gas equivalent partial pressure.

The silicon wafer of the present invention includes a portion sliced from a straight body section of the silicon single crystal grown using the above method for growing a silicon single crystal, wherein the LPD density of LPD of 0.09 µm or greater in the surface after 10 times of repetition of SC-1 cleaning is $0.1/cm^2$ or less.

In the present invention, the "Wright etching defect" means "a defect to be detected using an optical microscope after an As-Grown silicon wafer is subjected to the following treatment". The silicon wafer is subjected to a cupper decoration in which the wafer is immersed into a copper sulfate solution, dried naturally and heat-treated at 900° C. for approximately 20 minutes in the nitrogen gas ambient. And then, in order to remove a Cu silicide layer in the surface layer of the wafer, the wafer is immersed into a mixed solution of $HF/HNO_3$ so as to etch and remove the surface layer by tens of microns. Thereafter the wafer surface is subjected to a Wright-etching (cromic acid etching) by 2 microns. In accordance with this treatment and evaluation, the dislocation cluster defects formed during the crystal growth are exposed by the copper decoration, and the dislocation cluster defects can be detected with excellent sensitivity.

Moreover, the "LPD" is "a defect to be detected using a particle counter by the laser light scattering method (SPI (Surfscan SPI): manufactured by KLA-Tencor)."

The "Secco etching defect" is "a defect to be detected in the surface using an optical microscope after an As-Grown silicon wafer is subjected to Secco-etching using a Secco solution for 30 minutes without agitation".

The "SC-1 cleaning" means "to immerse a silicon wafer into a SCI solution in which the mixture ratio of $NH_4OH$: $H_2O_2$:$H_2O$ is 1:1:5 and the concentration ratio of $NH_4OH$: $H_2O_2$:$H_2O$ is 4 vol %:4.4 vol %:91.6 vol %".

The inventors of the present invention were dedicated to research, and discovered that in the case in which an ambient gas where a single crystal is grown contains a gas of hydrogen-containing substance, and a pull rate is a rate at which the dislocation cluster defect occurrence region is formed in at least a portion of the radial cross section of the silicon single crystal and the pull rate is slower than that at which an laser scattering tomography defect occurrence region is formed, silicon wafers obtained from the grown silicon single crystal have the following excellent properties.

In the present invention, "a pull rate at which the dislocation cluster defect occurrence region is formed in at least a portion of the radial cross section of the silicon single crystal, and which is slower than that at which the laser scattering tomography defect occurrence region is formed" means a pull rate at which the laser scattering tomography defect occurrence region is not formed but the dislocation cluster defect occurrence region is formed in the grown silicon single crystal. Specifically, for example, the pull rate corresponds to the range below F in FIG. 2, the range below C in FIG. 3 and the range below E in FIG. 4.

In other words, in the case in which hydrogen atoms are contained in ambient gas where the single crystal is grown, since silicon interstitial and hydrogen are bonded, scattering becomes slower and assembling is inhibited when dislocation cluster defects are formed. Concurrently, when the formed dislocation cluster defect expands by stresses inside the crystal, the hydrogen in the single crystal prevents dislocation movement and mobility is decreased. Therefore, in the case in which hydrogen atoms are contained in the ambient gas where a single crystal is grown, the density of the dislocation cluster defects inside the crystal does not change; however, since the size of the dislocation cluster defects becomes smaller, the density of the dislocation cluster defects having the greater size becomes lower. Therefore, in accordance with the present invention, a silicon wafer suitable for an LPD monitoring wafer with high accuracy can be realized.

In addition, the inventors of the present invention were dedicated to research, and discovered the following. The case in which the hydrogen gas equivalent partial pressure of the gas of the hydrogen-containing substance in the ambient gas (hydrogen-atom-containing substance) is set at 40 to 400 Pa, and the pull rate is set to be slower than that at which the Wright etching defect density in the radial cross section of the silicon single crystal becomes $5\times10^4/\text{cm}^2$ or greater (or the Secco etching defect density in the radial cross section of the silicon single crystal is $3\times10^4/\text{cm}^2$ or greater) and faster than that at which the LSTD density of LSTD of 0.09 μm or greater in the radial cross section of the silicon single crystal becomes $2/\text{cm}^2$ or less, a silicon wafer can be obtained which can be suitably used as a LPD monitoring wafer with high accuracy, and which can also detect previously undetectable dislocation cluster defects.

Table 1 shows the relationship among the hydrogen partial pressure of the hydrogen gas as a gas of the hydrogen-containing substance in the ambient gas where a single crystal is grown, the Wright etching defect density, the Secco etching defect density, and an LPD densities of LSTD of 0.09 μm or greater before and after SC-1 cleaning was conducted 10 times.

The hydrogen concentration in the silicon melt is determined depending upon the hydrogen partial pressure of the vapor phase according to the Henry"s law, and is expressed as follows:

$$P_{H2} = k\ C_{LH2}$$

Herein, $P_{H2}$ indicates the hydrogen partial pressure in the gas ambient; $C_{LH2}$ indicates the hydrogen concentration in the silicon melt; and k indicates the coefficient between the two.

In the meantime, the concentration in the silicon single crystal is determined according to the relationship between the concentration in the silicon melt and segregation, expressed as follows:

$$C_{SH2} = k''\ C_{LH2} = (k''/k) P_{H2}$$

Here, $C_{SH2}$ indicates the hydrogen concentration in the crystal, and k" indicates the segregation coefficient of hydrogen between the silicon melt and the crystal.

TABLE 1

| Experimental Example | H₂ Partial Pressure | Copper decoration defect density + Wright etching defect density (×10⁴/cm²) | Secco etching defect density (×10⁴/cm²) | LPD densities before and after 10 times SC-1 cleaning | |
|---|---|---|---|---|---|
| | | | | Before | After |
| 1 | 0 | 12.1 | 3.1 | 0.048 | 0.39 |
| 2 | 30 | 11.9 | 4.5 | 0.052 | 0.26 |
| 3 | 40 | 9.7 | 3.8 | 0.058 | 0.063 |
| 4 | 240 | 12.8 | 4.1 | 0.030 | 0.032 |
| 5 | 400 | 13.1 | 3.2 | 0.034 | 0.041 |

As shown in Table 1, in the silicon wafers obtained from the silicon single crystal grown using the method for growing a silicon single crystal according to the present invention (Experimental examples 3 to 5 in Table 1), even if the Wright etching defect density and the Secco etching defect density are the same level as those in the case of not containing hydrogen atoms in the ambient gas where a single crystal is grown (Experimental example 1 in Table 1), the LSTD density of LSTD of 0.09 μm or greater which is dislocation cluster defect becomes lower. Consequently, the LPD density of LPD of 0.09 μm or greater which is exposed by the repetition of the SC-1 cleaning 10 times lowers.

As shown in Table 1, in the case in which the hydrogen molecular partial pressure is set at less than 40 Pa, an effect to lower the LSTD density of LSTD of 0.09 μm or greater or another effect to lower the LPD density of LPD of 0.09 μm or greater which increases due to the SC-1 cleaning cannot be sufficiently obtained; thetefore, it is not preferable. If 0.09 μm or greater of the LPDs exist with higher density, when it is used as the LPD monitoring wafer, there are some cases in which excellent accuracy cannot be obtained.

Moreover, in the case in which the hydrogen partial pressure of the gas of the hydrogen-containing substance in the gas ambient is set at 400 Pa or less, even when air leaks and flows into the apparatus for growing the silicon single crystal, it is possible to safely operate the apparatus without combustion.

In the apparatus where a silicon single crystal is grown, hydrogen which is in proportion to the hydrogen partial pressure contained in the inert gas ambient is integrated into the silicon melt and distributed into the solidified silicon crystal.

As described above, when a silicon single crystal is grown in an inert gas ambient containing hydrogen, the hydrogen concentration immediately after the solidification may be controlled to be at a desired constant concentration in the axial direction of the crystal by controlling the partial hydrogen pressure in the gas ambient. This partial hydrogen pressure can be controlled by the hydrogen concentration and the furnace pressure.

Here, most of hydrogen which affects the formation of the grown-in defects is dissipated outside the silicon single crystal in the cooling process.

When a gas ambient for growing a single crystal is a mixture of inert gas and a gas of the hydrogen-containing substance and the hydrogen partial pressure contained in the inert gas ambient is adjusted, the pull rate margin at each defect region may be adjusted.

FIG. 5 is a graph showing the relationship between the hydrogen partial pressure in the gas ambient and V/G. As long as the hot zone structure is the same, since the temperature distribution inside the growing single crystal is scarcely changed even if the pull rate is changed, V/G shown in FIG. 5 is regarded as the pull rate.

As shown in FIG. 5, in the method for growing a silicon single crystal of the present invention, setting the hydrogen partial pressure of the gas of the hydrogen-containing substance in the ambient gas at 40 to 400 Pa enables an effective increase of the pull rate margin of a defect-free crystal. Consequently, in the present invention, in the case in which the silicon single crystal containing the dislocation cluster defect occurrence region is grown at a comparatively fast pull rate close to the pull rate of a defect-free crystal, it becomes easy to separately grow any defect-free crystal in the silicon single crystal without mixed with defect regions. Consequently, it can be easy to manufacture a homogeneous silicon single crystal from which wafers having the dislocation cluster defect occurrence region throughout the entire surface thereof can be obtained.

In the case in which the hydrogen partial pressure is set to less than 40 Pa, the effect to increase the pull rate margin of a defect-free crystal cannot be sufficiently obtained; therefore it is not preferable. In the case in which the hydrogen partial pressure of the hydrogen-containing substance in the ambient gas is set at 400 Pa or less, even if the air leaks and flows into an apparatus for growing a silicon single crystal, it is possible to safely operate the apparatus for growing a single crystal without combustion.

Moreover, in the present invention, in the case in which the silicon single crystal is grown using a hot zone structure where the temperature gradient at the center of the crystal (Gc) is the same or greater than a temperature gradient at the outer circumferential portion of the crystal (Ge) (Gc≧Ge), as shown in FIG. 3 and FIG. 4, in a defect region which has a possibility to be distributed with the dislocation cluster defect occurrence region, only a PI region is distributed. Therefore, it is easy to grow a silicon single crystal in which any defect regions are not distributed with each other.

In the method for growing a silicon single crystal of the present invention, the hydrogen-containing substance is a substance having hydrogen atom in its molecule, and is a substance that is thermally decomposed when integrated into the silicon melt, and that can supply hydrogen atoms to the silicon melt. Examples of this hydrogen-containing substance includes hydrogen gas. The hydrogen concentration in the silicon melt can be improved by mixing the hydrogen-containing substance into the inert gas and adding the mixed gas into the gas ambient where the silicon single crystal is grown.

As the gas of the hydrogen-containing substance, hydrogen gas may be used, and also for example, one or more of gases may be used which are selected from gases of substances containing hydrogen atom, such as inorganic compounds containing hydrogen atoms such as $H_2O$ and HCl, silane gas, hydrocarbon such as $CH_4$ and $C_2H_2$, alcohol, carboxylic acid and the like.

Here, in the case in which hydrogen gas is used as a gas of the hydrogen-containing substance, hydrogen gas may be supplied to the furnace for pulling a single crystal via an exclusive piping from a commercial hydrogen compressed gas cylinder, a hydrogen gas storage tank or a hydrogen tank where hydrogen is occluded in the hydrogen storage alloy.

As an inert gas (noble gas), one or more of gases selected from Ar, He, Ne, Kr and Xe may be used. Usually, inexpensive argon (Ar) gas is used. However, any gas where other inert gas such as He, Ne, Kr or Xe is mixed into the Ar gas may be used.

In the present invention, the concentration of the hydrogen-containing substance in the hydrogen-containing gas ambient is set within a range as hydrogen gas equivalent partial pressure. Here, the reason why the hydrogen gas equivalent partial pressure is used is that the amount of the hydrogen atoms obtained by the thermal decomposition of the hydrogen-containing substance depends upon the number of hydrogen atoms contained in a molecule of the hydrogen-containing substance. For example, although one molecule of $H_2$ is contained in one molecule of $H_2O$, only 0.5 molecule of $H_2$ are contained in one molecule of HCl. Therefore, in the present invention, it is desirable that a hydrogen-containing gas ambient in which hydrogen gas is mixed with inert gas within the above-described range of the hydrogen gas equivalent partial pressure should be regarded as a standard, and the concentration (partial pressure) of the hydrogen-containing substance should be adjusted so as to obtain a gas ambient which has the same concentration (partial pressure) as that of the standard gas ambient. In the present invention, this partial pressure of the hydrogen-containing substance is defined as the hydrogen gas equivalent partial pressure.

In other words, in the present invention, under the assumption that the hydrogen-containing substance is dissolved in the silicon melt and thermally decomposed into hydrogen atoms in the silicon melt, the addition of the amount of hydrogen-containing substance should be controlled so as to adjust an amount of the hydrogen atoms to be decomposed (proportional to the hydrogen gas equivalent partial pressure in the gas ambient) to be within a desired range.

In accordance with the method for growing a single crystal of the present invention, a single crystal is grown in the hydrogen-containing gas ambient in which the hydrogen-containing substance is mixed in the inert gas at the hydrogen gas equivalent partial pressure within the above-described range. Hydrogen originating from the hydrogen-containing substance is dissolved into the silicon melt, and then the hydrogen is taken into the silicon when the silicon is solidified.

Here, in the case in which oxygen gas ($O_2$) exists in an inert gas ambient, a concentration difference between the hydrogen molecular equivalent concentration of the gas ambient and twice of the oxygen gas concentration may be 3% by volume or greater. In the case in which the concentration difference between the hydrogen molecular equivalent concentration of the gas ambient and twice of the oxygen gas concentration is less than 3% by volume, the effects to inhibit the generation of the grown-in defects such as the COP or the dislocation cluster defects due to the hydrogen atoms taken into the silicon crystal cannot be obtained.

When the nitrogen concentration as an impurity in the inert gas becomes high, the silicon crystal is dislocated. Therefore, it is preferable that the nitrogen concentration be 20% or less when the furnace pressure is in a normal range of 1.3 to 13.3 kPa (10 to 100 Torr).

In accordance with the present invention, a silicon single crystal can be grown in which an LSTD density of LSTD of 0.09 μm or greater which is the dislocation cluster defect is low. Since in silicon wafers obtained using the grown silicon single crystal, the LSTD density is low and the LPD density of LPD of 0.09 μm or greater which is increased by repeating SC-1 cleaning 10 times is also low, the silicon wafers is suitably used as an LPD monitoring wafer.

PREFERRED EMBODIMENTS

Figure 1:
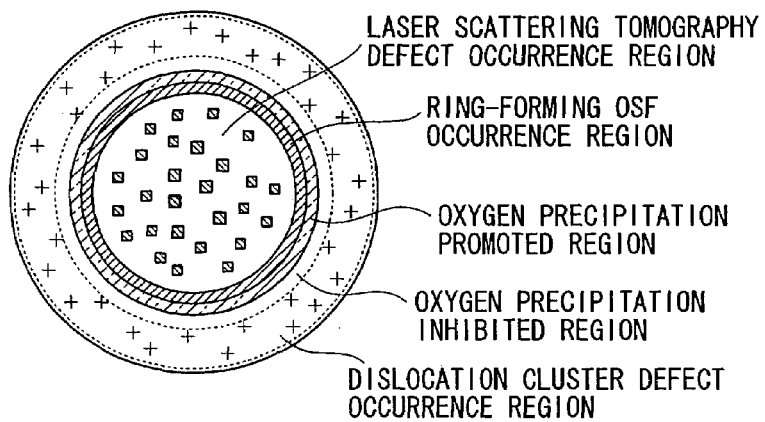
FIG. 1 is a cross sectional view for explaining a defect distribution state in the radial silicon single crystal obtained using the CZ method.
Figure 2:
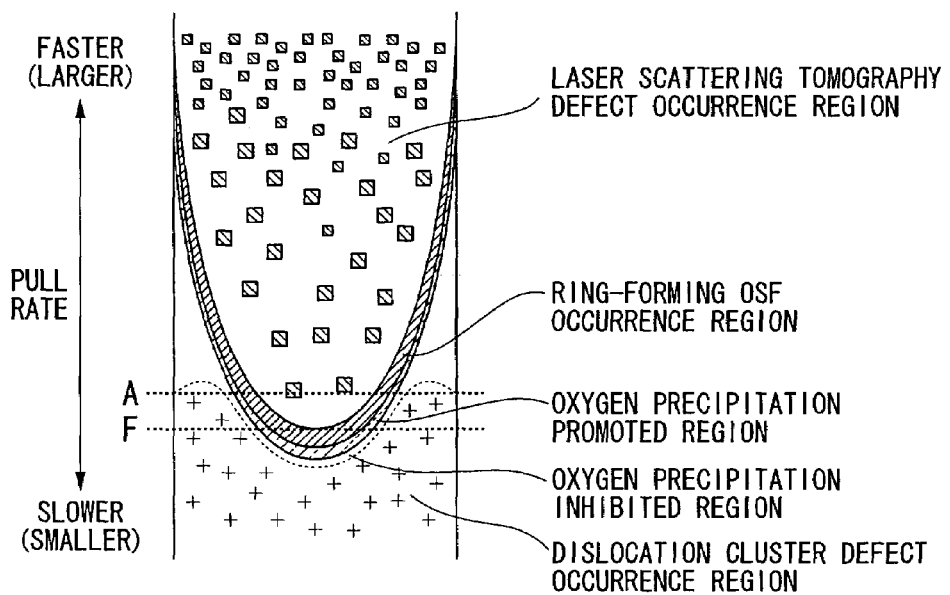
FIG. 2 is a drawing for explaining another defect distribution state of the cross section of the silicon single crystal grown by gradually decreasing a pull rate at the time of the growth.

A first embodiment according to the present invention is explained hereafter, based upon the drawing.

Figure 6:
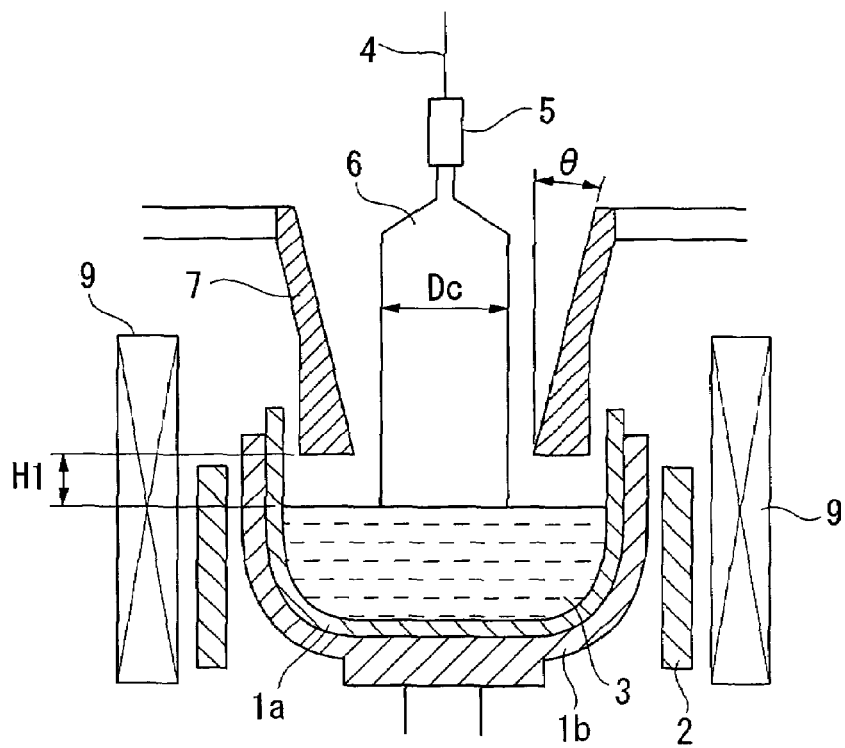
FIG. 6 is a longitudinal sectional view of a CZ furnace that is suitable for implementing the method for growing a silicon single crystal according to the present invention.

FIG. 6 is a longitudinal sectional view of a CZ furnace that is suitable for implementing the method for growing a silicon single crystal in the present embodiment.

The CZ furnace shown in FIG. 6 is equipped with a crucible 1 arranged in the center within a chamber, a heater 2 arranged outside the crucible 1 and a magnetic field supplier 9 arranged outside the heater 2. The crucible 1 has a double structure to hold a quartz crucible 1a where silicon melt 3 is internally contained in a graphite crucible 1b, and is driven to rotate and move up and down by a support shaft referred to as a pedestal.

A cylindrical thermal shielding body 7 is established above the crucible 1. The thermal shielding body 7 has a structure where an outer shell is formed from graphite, and the inside is filled with graphite felt. The internal surface of the thermal shielding body 7 is a taper surface where the internal diameter gradually decreases from the upper end to the lower end. An upper external surface is formed as a taper surface corresponding to the internal surface, and a lower external surface is formed to be a substantially straight surface to gradually increase the thickness of the thermal shielding body 7 downward.

The CZ furnace is equipped with a hot zone structure where the temperature gradient at the center of crystal (Gc) is the same or greater than a temperature gradient at the outer circumferential portion of the crystal (Ge) (Gc≧Ge).

The thermal shielding body 7 blocks radiant heat from the heater 2 and a surface of the silicon melt 3 to the side of the silicon single crystal 6, surrounding the side of the growing silicon single crystal 6; and concurrently, surrounding the surface of the silicon melt 3. An example of a specification of the thermal shielding body 7 is as follows:

The radial width, for example, is 50 mm; the incline θ of the internal surface, which is an inverted cone surface, relative to the perpendicular direction, for example, is 21°; and the height H1 of the thermal shielding body 7 from the lower end of the melt surgace, for example, is 60 mm.

Furthermore, a water-cooling means to cool the side of the growing silicon single crystal 6 may be arranged inside the lower end of the thermal shielding body 7. As the water-cooling means, a coil-state flow tube made from copper and a water-cooling jacket having a flowing bulkhead made from iron may be mentioned.

Moreover, regarding the intensity of the magnetic field supplied from the magnetic field supplier 9, the horizontal field (transverse field) is set within the range of 2,000 to 4,000 G, more preferably 2,500 to 3,500 G. and the height of the magnetic field center is set within the range of −150 to +100 mm, more preferably −75 to +50 mm, relative to the liquid level of the melt.

Moreover, regarding a cusped magnetic field, the intensity of the magnetic field supplied from the magnetic field supplier 9 is set within the range of 200 to 1,000 G, more preferably within the range of 300 to 700 G and the height of the magnetic field center is set within the range of −100 to +100 mm, more preferably within the range of −50 to +50 mm, relative to the liquid level of the melt.

Supplying the magnetic field within the ranges of the intensity and the height of the magnetic field center from the magnetic field supplier 9 enables control of convection and the obtainment of a preferable configuration for the solid-liquid interface.

Next, a method for growing the silicon single crystal 6 using the CZ furnace shown in FIG. 6 and using a mixed gas of inert gas and hydrogen gas as an ambient gas where a single crystal is grown is explained.

Setting of Operating Conditions

First, in order to understand operating conditions, such as an allowable level of pull rate for a silicon single crystal composed with a target dislocation cluster defect generation region, the hydrogen partial pressure in the ambient gas, for example, is 0, 20, 40, 160, 240 or 400 Pa of mixing ratio, and the single crystal with a target diameter, for example, 300 mm, is grown under each condition.

In other words, for example, 300 kg of polycrystal silicon with high purity are charged into the crucible, and a p-type (such as B, Al or Ga) or n-type (such as P, As or Sb) dopant is added to obtain a desired value of single crystal electric resistivity, for example 10 Ωcm. The pressure in the device is at reduced pressure, 1.33 to 26.7 kPa (10 to 200 torr), in the argon gas ambient, and the hydrogen partial pressure in the ambient gas is adjusted to a predetermined mixing ratio and flown in.

Next, for example, 3,000 G of the horizontal field is supplied from the magnetic field supplier 9 so as to have −75 to +50 mm of the height of the magnetic field center relative to the liquid level of the melt. Concurrently, the polycrystal silicon is heated by the heater 2 and the silicon melt 3 is obtained, and a seed crystal mounted in a seed chuck 5 is immersed in the silicon melt 3, and the crystal is grown while the crucible 1 and a growth axis 4. At this time, the rotation velocity of the crucible, the furnace pressure and the heater are adjusted to a desired oxygen concentration. The crystal orientation is either {100}, {111} or {110}, and after the seed is squeezed for the dislocation-free crystal, a shoulder is formed, replaced and adjusted to a target body diameter.

When the body length achieves, for example, 300 mm, the pull rate is adjusted to a value which is sufficiently greater than a critical pull rate, for example, 1.0 mm/min. Then, the pull rate is almost linearly decreased according to the growth length, and the pull rate is adjusted to a value, for example, of 0.3 nm/min, which is smaller than the critical pull rate when the body length achieves, for example, 600 mm. Then, the body is grown to, for example, 1,800 mm, at this pull rate, and after a tail is squeezed under normal conditions, the crystal growth is completed.

As described, the single crystal grown with different hydrogen concentrations is divided vertically along the growth axis and plate specimens including the vicinity of the growth axis is produced. In order to observe the distribution of the grown-in defects, Cu is decorated. First, after each specimen is immersed into a copper sulfate solution, they are dried with air, and are thermally processed at 900° C. for approximately 20 minutes in a nitrogen gas ambient. Subsequently, in order to remove the Cu silicide layer from the surface layer of the specimens, they are immersed into a mixed solution of HF/HN3, and after the tens of microns of the surface layer is etched and removed, the position of the OSF ring and the distribution of each defect region are examined using X-ray topography. Moreover, the COP density of the sliced specimens and the density of the dislocation cluster defects are examined, for example, using the OPP method and the Secco etching method, respectively.

With the growth experiment, the relationship between V/G and the hydrogen concentration in each defect region of the laser scattering tomography defect occurrence region, the OSF occurrence region, the PV region, the PI region and the dislocation cluster defect occurrence region may be obtained. Moreover, when the pull rate is changed at several positions, such as from 300 mm to 600 mm, from 500 mm to 800 mm and from 700 mm tot 1,000 mm, the relationship between the allowable range of the pull rate (pull rate margin), which is slower than a pull rate to have $5\times10^4/cm^2$ or greater of the Wright etching defect density on the radial cross section of the silicon single crystal (or $3\times10^4/cm^2$ or greater of the Secco etching defect density on the radial cross section of the silicon single crystal), and which is faster than a pull rate to have $2/cm^2$ or less of the LSTD density of LSTD of 0.09 μm or greater on the radial cross section of the silicon single crystal, and the crystal axis direction position is obtained, making it possible to set the operating conditions.

Growth of Silicon Single Crystal

Next, the silicon single crystal 6 is grown using the CZ furnace shown in FIG. 6 and using a mixed gas of inert gas and hydrogen gas as an ambient gas where a single crystal is grown under the appropriate operating conditions set according to the method.

When the silicon single crystal is grown as described, a silicon single crystal wafer is processed via processes of slicing using a cutter, such as an ID saw or a wire saw, chamfering, wrapping, etching and polishing in compliance with normal processing methods. Furthermore, there are various processes other than these processes, such as cleaning, and the processes may be changed for any purpose, such as a change or omission in the process order.

EXAMPLES

The following experiments were conducted in order to verify the present invention:

Experimental Examples 1 to 5

Figure 3:
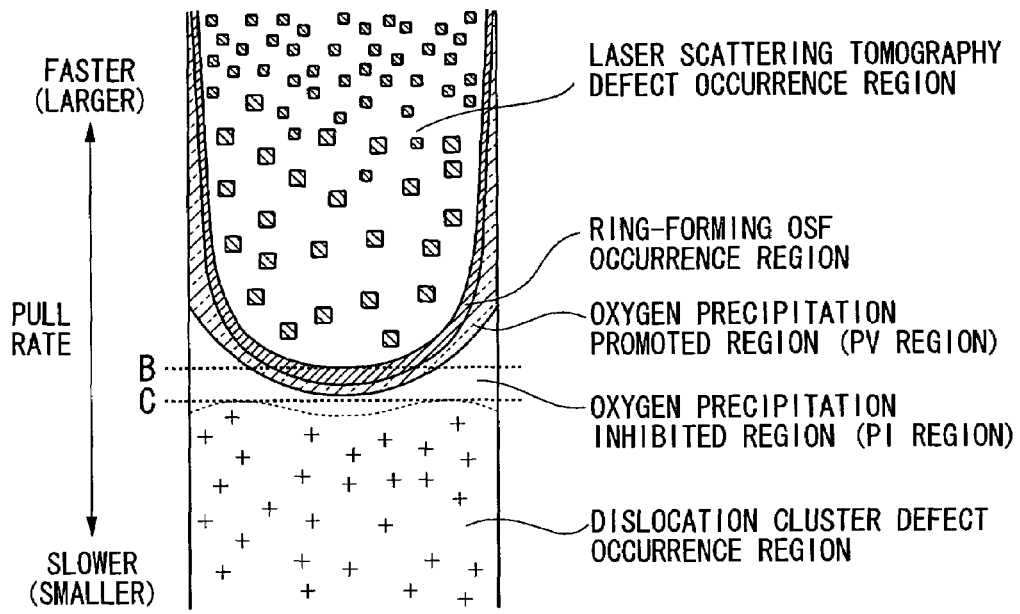
FIG. 3 is a drawing for explaining another defect distribution state of the cross section of the silicon grown by gradually decreasing a pull rate at the time of the growth using an apparatus for growing a single crystal having a hot zone structure where a temperature gradient at the center of the crystal (Gc) is the same or greater than a temperature gradient at the outer circumferential portion of the crystal (Ge) (Gc≧Ge).
Figure 4:
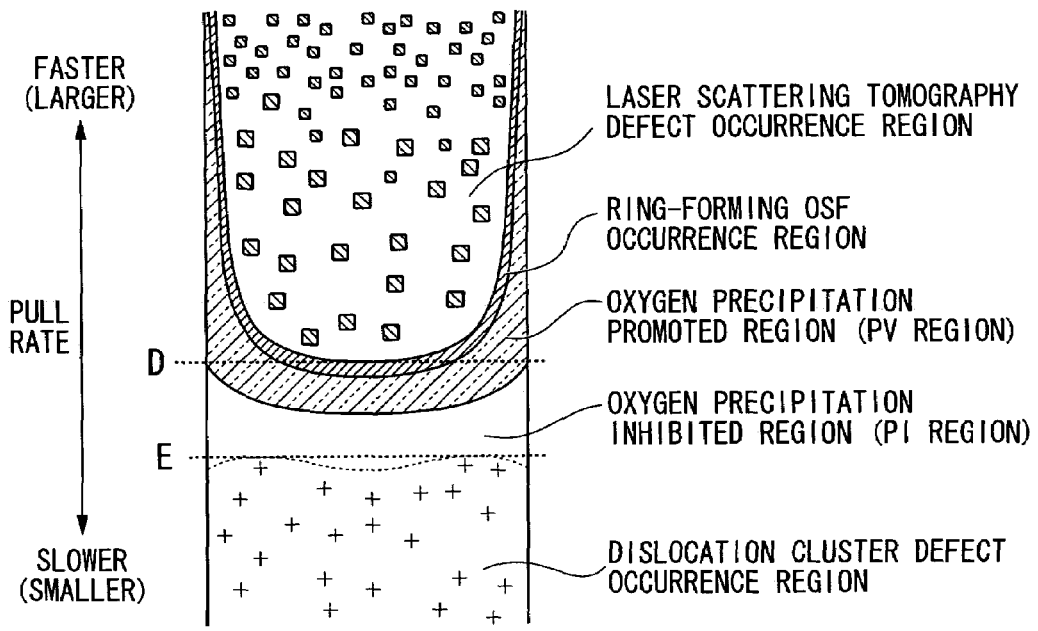
FIG. 4 is a drawing for explaining another defect distribution state of the cross section of the silicon single crystal grown by supplying an inert gas where hydrogen has been added into a growth furnace and by gradually decreasing a pull rate at the time of the growth, using an apparatus for growing a single crystal having the hot zone structure where (Gc≧Ge), which is the same as that in FIG. 3.
Figure 5:
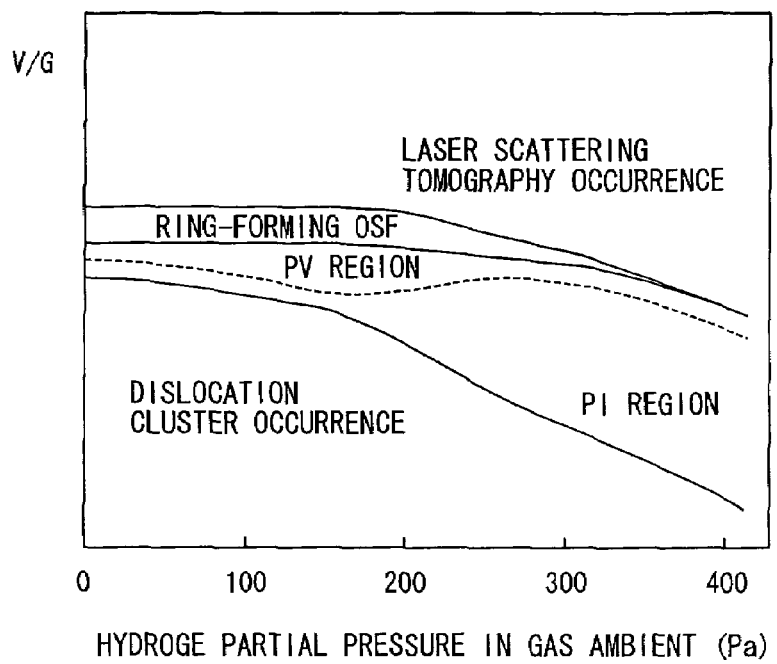
FIG. 5 is a graph showing a relationship between the hydrogen partial pressure in the gas ambient and V/G.

Using the apparatus for growing a single crystal having the hot zone structure where (Gc≧Ge), which is the same apparatus for growing a single crystal used when manufacturing the silicon single crystal in FIG. 3, an inert gas where hydrogen had been added was supplied to the growth furnace to establish the hydrogen partial pressure in Experimental examples 1 to 5 shown in Table 1, respectively, and the silicon single crystal was grown at the pull rate to establish $5\times10^4/cm^2$ or greater of the Wright etching defect density on the radial cross section of the silicon single crystal, and $3\times10^4/cm^2$ or greater of the Secco etching defect density, and the obtained silicon single crystal was sliced and silicon wafers in Experimental examples 1 to 5 were obtained, respectively.

Then, the LPD density of LPD of 0.09 μm or greater before and after 10 times of repetition of the SC-1 cleaning of the surface of the silicon wafers in Experimental examples 1 to 5 was obtained, respectively.

The results are shown in Table 1.

As shown in Table 1, in the Experimental examples 3 to 5 where the hydrogen partial pressure was 40 to 400 Pa, the LPD density of LPD of 0.09 μm or greater in the surface after 10 times of repetition of SC-1 cleaning became $0.1/cm^2$ or less. In the meantime, in the Experimental examples 1 and 2, the LPD density was over $0.1/cm^2$.

Some preferred embodiments of the invention have been described above, although these embodiments are to be considered in all respects as illustrative and not limitative. Those skilled in the art will appreciate that various additions, omissions, substitutions and other modifications are possible without departing from the scope of the invention as disclosed in the accompanying claims.

What is claimed is:

1. A method for growing a silicon single crystal, the method comprising growing a silicon single crystal by the Czochralski method,
    wherein an ambient gas in which the silicon single crystal is grown includes a hydrogen-containing substance in gaseous form, and said silicon single crystal is grown at a pull rate at which dislocation cluster defect occurrence region is formed at least in a portion of the radial cross section of said silicon crystal, and at a pull rate slower than that at which an laser scattering tomography defect occurrence region is formed.

2. The method for growing a silicon single crystal according to claim 1, wherein, a hot zone structure where a temperature gradient at the center of the crystal (Gc) is the same or greater than that at the outer circumferential portion of the crystal (Ge) (Gc≧Ge) is used, and
    said silicon single crystal is grown within a pull rate range where an almost entire radial region of said silicon single crystal becomes the dislocation cluster defect occurrence region.

3. The method for growing a silicon single crystal according to claim 1, wherein said silicon single crystal is grown at a pull rate slower than that at which a dislocation cluster defect occurrence region where the Wright etching defect density becomes $5\times10^4/cm^2$ or greater on the radial cross section of said silicon single crystal.

4. The method for growing a silicon single crystal according to claim 1, wherein said silicon single crystal is grown at a pull rate slower than that at which a dislocation cluster defect occurrence region where the Secco etching defect density becomes $3\times10^4/cm^2$ or greater on the radial cross section of said silicon single crystal.

5. The method for growing a silicon single crystal according to claim 1, wherein said hydrogen-containing substance in gaseous form is hydrogen gas.

6. The method for growing a silicon single crystal according to claim 1, wherein the concentration of the hydrogen-containing substance in said ambient gas is within the range of 40 to 400 Pa of hydrogen gas equivalent partial pressure.

7. A silicon wafer, comprising a portion sliced from a straight body section of the silicon single crystal grown using the method for growing a silicon single crystal according to claim 1,
    wherein the LPD density of LPD of 0.09 μm or greater in the surface after 10 times of repetition of SC-1 cleaning is $0.1/cm^2$ or less.

* * * * *